United States Patent
Cohen

(10) Patent No.: US 11,211,556 B1
(45) Date of Patent: Dec. 28, 2021

(54) RESISTIVE ELEMENT FOR PCM RPU BY TRENCH DEPTH PATTERNING

(71) Applicant: International Business Machines Corporation, Armonk, NY (US)

(72) Inventor: Guy M. Cohen, Ossining, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/933,516

(22) Filed: Jul. 20, 2020

(51) Int. Cl.
*G11C 13/00* (2006.01)
*H01L 45/00* (2006.01)

(52) U.S. Cl.
CPC ........ *H01L 45/126* (2013.01); *G11C 13/0004* (2013.01); *G11C 13/0069* (2013.01); *H01L 45/06* (2013.01); *H01L 45/1226* (2013.01); *H01L 45/16* (2013.01); *G11C 2013/008* (2013.01)

(58) Field of Classification Search
CPC ....... H01L 45/126; H01L 45/06; H01L 45/16; H01L 45/1226; G11C 13/0004; G11C 13/0069; G11C 2013/008
USPC .................................................. 365/158, 163
See application file for complete search history.

(56) References Cited

U.S. PATENT DOCUMENTS

| | | | |
|---|---|---|---|
| 6,960,744 B2 | 11/2005 | Adkisson et al. | |
| 7,038,231 B2 | 5/2006 | Hart et al. | |
| 7,271,463 B2 | 9/2007 | Smythe, III et al. | |
| 7,394,089 B2 | 7/2008 | Doyle et al. | |
| 7,671,360 B2 * | 3/2010 | Sato | H01L 45/144 257/42 |
| 7,880,194 B2 | 2/2011 | Breitwisch et al. | |
| 7,985,616 B1 | 7/2011 | Sutardja et al. | |
| 8,030,128 B1 | 10/2011 | Sutardja et al. | |
| 8,071,423 B2 * | 12/2011 | Joo | H01L 45/1691 438/102 |
| 8,158,965 B2 | 4/2012 | Chen | |
| 8,273,598 B2 * | 9/2012 | Breitwisch | H01L 45/1683 438/95 |
| 8,283,198 B2 * | 10/2012 | Wells | H01L 27/2463 438/95 |
| 9,136,472 B2 * | 9/2015 | Wells | H01L 45/144 |
| 9,246,093 B2 | 1/2016 | Zanderighi et al. | |
| 9,396,986 B2 | 7/2016 | Tsai et al. | |
| 10,374,010 B2 * | 8/2019 | Wu | H01L 45/144 |

(Continued)

OTHER PUBLICATIONS

Sidorkin et al., "Resist thickness effects on ultra thin HSQ patterning capabilities," Microelectronic Engineering 86, No. 4-6, pp. 749-751 (Jan. 2009).

(Continued)

*Primary Examiner* — Michael T Tran
(74) *Attorney, Agent, or Firm* — Erik Johnson; Michael J. Chang, LLC

(57) ABSTRACT

Resistive elements for PCM RPUs and techniques for fabrication thereof using trench depth pattering are provided. In one aspect, an RPU device includes: a first electrode; a second electrode; a heater; and a PCM disposed over the first electrode, the second electrode and the heater, wherein the heater includes a combination of a first material having a resistivity r1 and a second material having a resistivity r2, wherein r1>r2, and wherein only the first material is present beneath the PCM and forms a resistive heating element. A method of operating an RPU device is also provided.

19 Claims, 6 Drawing Sheets

(56) References Cited

U.S. PATENT DOCUMENTS

| | | | |
|---|---|---|---|
| 10,839,897 B1* | 11/2020 | Bai | G11C 13/0035 |
| 2003/0040135 A1* | 2/2003 | Trammel | G02F 1/0147 |
| | | | 438/29 |
| 2004/0197947 A1* | 10/2004 | Fricke | G11C 13/0004 |
| | | | 438/102 |
| 2006/0158928 A1* | 7/2006 | Pellizzer | H01L 27/2463 |
| | | | 365/163 |
| 2008/0048293 A1* | 2/2008 | Horii | H01L 45/16 |
| | | | 257/536 |
| 2008/0105861 A1* | 5/2008 | Hosaka | H01L 27/2436 |
| | | | 257/4 |
| 2008/0283817 A1* | 11/2008 | Yu | H01L 45/06 |
| | | | 257/4 |
| 2009/0194758 A1* | 8/2009 | Chen | H01L 45/148 |
| | | | 257/4 |
| 2011/0233503 A1* | 9/2011 | Hwang | H01L 45/126 |
| | | | 257/2 |
| 2012/0322223 A1* | 12/2012 | Oh | H01L 27/2409 |
| | | | 438/382 |
| 2015/0147844 A1* | 5/2015 | Kwon | H01L 45/1683 |
| | | | 438/102 |
| 2019/0189230 A1* | 6/2019 | Chung | G11C 17/18 |
| 2020/0013951 A1* | 1/2020 | Wu | H01L 45/126 |
| 2020/0091234 A1* | 3/2020 | Lee | H01L 45/126 |
| 2020/0133033 A1* | 4/2020 | Bhaskaran | G02F 1/0121 |
| 2020/0135251 A1* | 4/2020 | Osborne | G11C 11/1673 |
| 2020/0135273 A1* | 4/2020 | Pasotti | G11C 13/0097 |
| 2020/0136036 A1* | 4/2020 | Wu | H01L 27/24 |
| 2020/0136043 A1* | 4/2020 | Ok | H01L 45/1253 |
| 2020/0168264 A1* | 5/2020 | Endoh | G11C 11/2253 |
| 2020/0185603 A1* | 6/2020 | Chen | H01L 45/144 |
| 2020/0273946 A1* | 8/2020 | Kim | H01L 45/1233 |
| 2020/0287134 A1* | 9/2020 | Ok | H01L 45/141 |
| 2020/0303638 A1* | 9/2020 | Cheng | H01L 45/126 |
| 2020/0341503 A1* | 10/2020 | Rios Ocampo | G02F 7/00 |
| 2020/0388753 A1* | 12/2020 | Karpov | G11C 13/0097 |
| 2021/0057487 A1* | 2/2021 | Shea | H01L 21/8249 |
| 2021/0104665 A1* | 4/2021 | Heo | H01L 45/1625 |
| 2021/0135104 A1* | 5/2021 | Ok | H01L 45/144 |

OTHER PUBLICATIONS

Nabil El-Hinnawy et al., "A four-terminal, inline, chalcogenide phase-change RF switch using an independent resistive heater for thermal actuation," IEEE Electron Device Letters, vol. 34, No. 10, Oct. 2013, pp. 1313-1315.

* cited by examiner

RESISTIVE ELEMENT FOR PCM RPU BY TRENCH DEPTH PATTERNING

FIELD OF THE INVENTION

The present invention relates to phase change material (PCM) resistive processing units (RPUs), and more particularly, to resistive elements for PCM RPUs and techniques for fabrication thereof using trench depth patterning.

BACKGROUND OF THE INVENTION

A resistive processing unit (RPU) stores information based on the resistance of the RPU.

During programming, a SET operation is used to program the RPU to a low-resistance state representing a data value such as a logic '1' or a logic '0'. A subsequent RESET operation is then used to return the RPU to its previous high-resistance state.

As its name implies, a phase change material or PCM is a material that can be switched from one phase to another. Based on the properties of the different phases, PCMs have been explored for their use in RPUs. Namely, a PCM provides a relatively high resistance when it is in an amorphous phase, and a relatively low resistance when it is in a crystalline phase.

Conventional PCM RPU devices often employ the PCM material as a layer disposed between two electrodes. For instance, the PCM material can be disposed on a bottom electrode, and a top electrode disposed on the PCM material. This configuration is also referred to herein as a two-terminal design.

However, with a two-terminal PCM RPU design both programming and readout of the RPU is performed using the same two electrodes, which imposes some notable performance limitations. For instance, in a two-terminal PCM RPU, once a RESET pulse is applied the bottom electrode becomes covered by amorphous PCM. At that point, any additional RESET pulses will not change the amorphous region.

Accordingly, improved PCM RPU designs and techniques for fabrication thereof would be desirable.

SUMMARY OF THE INVENTION

The present invention provides resistive elements for phase change material (PCM) resistive processing units (RPUs) and techniques for fabrication thereof using trench depth patterning. In one aspect of the invention, an RPU device is provided. The RPU device includes: a first electrode; a second electrode; a heater; and a PCM disposed over the first electrode, the second electrode and the heater, wherein the heater includes a combination of a first material having a resistivity r1 and a second material having a resistivity r2, wherein r1>r2, and wherein only the first material is present beneath the PCM and forms a resistive heating element.

In another aspect of the invention, a method of forming an RPU device is provided. The method includes: forming a first electrode and a second electrode on a substrate; forming a heater on the substrate in between the first electrode and the second electrode; and depositing a PCM onto the first electrode, the second electrode and the heater. The heater can be formed by patterning a trench in the substrate to a depth D1; depositing hydrogen silsesquioxane (HSQ) onto the substrate and into the trench to reduce the trench to a depth D2, wherein D1>D2; cross-linking the HSQ within the trench to form cross-linked HSQ in a select portion of the trench; removing non-cross-linked HSQ; depositing a first material having a resistivity r1 into the trench over the cross-linked HSQ; depositing a second material having a resistivity r2 over the first material, wherein r1>r2; and planarizing the first material and the second material such that, following the planarization, only the first material is present in the select portion of the trench and forms a resistive heating element.

In yet another aspect of the invention, a method of operating an RPU device is provided. The method includes: providing the RPU device including: a first electrode, a second electrode, a heater, and a PCM disposed over the first electrode, the second electrode and the heater; and applying a programming pulse to the heater to convert at least a portion of the PCM from a poly-crystalline state to an amorphous state.

A more complete understanding of the present invention, as well as further features and advantages of the present invention, will be obtained by reference to the following detailed description and drawings.

DETAILED DESCRIPTION OF PREFERRED EMBODIMENTS

As provided above, due to the nature of their design, two-terminal phase change material (PCM) resistive processing units (RPUs) have notable performance limitations based on the fact that both programming and readout of the RPU is performed using the same two electrodes. Advantageously, provided herein are four-terminal PCM RPU designs and techniques for fabrication thereof that separates the programming from the reading functions of the device. Namely, as will be described in detail below, separate terminals are used to program versus read the state (i.e., high resistance or low resistance state) of the RPU which provides a greater level of operational control as compared to conventional two-terminal designs.

Further, as will be described in detail below, programming of the RPU is achieved by a heater located proximate to the PCM that is used to change the phase of the PCM. Thus, no current has to be run through the PCM to change the phase of the PCM. By comparison, programming in conventional two-terminal designs is based on heat produced by the passage of an electric current through the PCM, and there is a limit on the amount of current that can be passed through the PCM material. This limitation on the maximum current limits the type of PCM materials that can be used in conventional designs to mostly highly resistive PCM in the crystalline phase. Lower resistance crystalline PCM requires two much current to switch. Advantageously, by decoupling the PCM material resistance from the resistive element resistance used for programing (proximity heater), even PCM materials with low resistance (in the crystalline) phase can be used. With a proximity heater for programming, the present PCM RPU devices effectively function as a variable resistor that can be tuned based on the size and duration of the current pulse applied to the heater and corresponding amount of amorphous phase PCM created.

Figure 1:
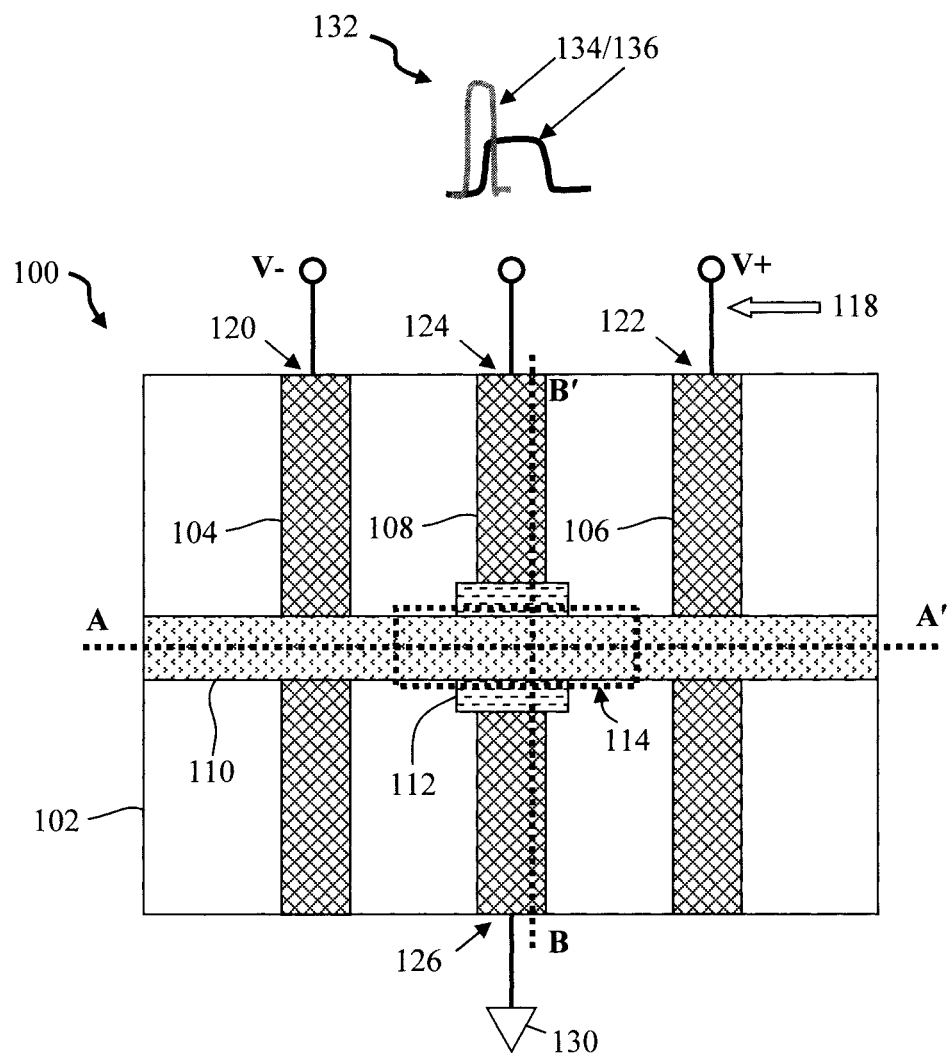
FIG. 1 is a top-down diagram illustrating an exemplary phase change material (PCM) resistive processing unit (RPU) device according to an embodiment of the present invention.

Referring to FIG. 1, a top-down view of a PCM RPU 100 in accordance with the present techniques is provided. As shown in FIG. 1, PCM RPU 100 includes a first electrode 104 and a second electrode 106 oriented parallel to one another on a substrate 102. A heater 108 is present on substrate 102 in between the first electrode 104 and the second electrode 106. In this exemplary embodiment, heater 108 is also oriented parallel to the first electrode 104 and the second electrode 106.

A PCM 110 is disposed over the first electrode 104, the second electrode 106 and the heater 108. In this exemplary embodiment, the PCM 110 is oriented orthogonal to the first electrode 104, the second electrode 106 and the heater 108. The PCM 110 is in direct contact with the first electrode 104 and the second electrode 106. However, as shown in FIG. 1, PCM 110 is separated from the heater 108 by an insulator 112. As will be described in detail below, insulator 112 is an electrical insulator that is at the same time a good thermal conductor.

As will become apparent from the description that follows, programming of PCM RPU 100 occurs via the heater 108. As shown in FIG. 1, one end of heater 108 is connected to ground 130. Resistance readout 118 of the PCM 110 occurs via the first electrode 104 and the second electrode 106. Thus, when reference is made herein to the four terminals of PCM RPU 100, these are the first electrode 104, the second electrode 106 and the two opposing ends of the heater 108 which are arbitrarily labeled in FIG. 1 as a first terminal 120, a second terminal 122, a third terminal 124 and a fourth terminal 126, respectively.

According to an exemplary embodiment, substrate 102 is a bulk semiconductor wafer, such as a bulk silicon (Si), bulk germanium (Ge), bulk silicon germanium (SiGe) and/or bulk III-V semiconductor wafer. Other materials such as glass and ceramic can also be used. Alternatively, substrate 102 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor. Substrate 102 may already have pre-built structures (not shown) such as transistors, diodes, capacitors, resistors, interconnects, wiring, etc.

First electrode 104 and the second electrode 106 can be formed from a material or a combination of materials. Suitable materials for the first electrode 104 and the second electrode 106 include, but are not limited to, metals such as titanium (Ti), tungsten (W) and/or titanium nitride (TiN).

As will be described in detail below, a unique process using trench depth patterning is provided herein for forming the heater 108. By this trench depth patterning approach, a relatively higher resistivity material (such as tantalum nitride (TaN)) is present in shallow regions of the trench, and a relatively lower resistivity material (such as titanium nitride (TiN)) is present in the deeper regions of the trench, resulting in a resistive element design that localizes the heating to the regions below the PCM 110.

A wide variety of materials can be employed as PCM 110 in accordance with the present techniques. In the sense that it can exist in amorphous and crystalline form almost any material is a phase change material, such as metals, semiconductors or insulators. However, only a small group of materials has the properties that makes them technologically useful PCMs, with high on/off resistance ratio, fast switching times and good data retention. Many technologically relevant PCMs are chalcogenides, i.e., they contain one or more chalcogenide elements. These are Group 16 in the periodic table, e.g., sulfur (S), selenium (Se) and/or tellurium (Te). According to one exemplary embodiment, PCM 110 is a chalcogenide alloy that includes the chalcogenide element Te, in addition to other elements such as antimony (Sb) and/or germanium (Ge), forming the alloys $Sb_2Te_3$, GeTe, and $Ge_2Sb_2Te_5$ (GST 225). Other technologically relevant materials for PCM 110 that are not chalcogenides include III-V semiconductor materials (such as gallium antimonide (GaSb)) or Ge—Sb based alloys. Often additional elements such as silver (Ag), indium (In), nitrogen (N) or bismuth (Bi) are added to the phase change alloys to optimize their properties.

The PCM 110 can be switched between two states, poly-crystalline (or single-crystal) and amorphous, based on heat produced by the heater 108. In the poly-crystalline state, each grain of the PCM 110 is a perfect crystal and the PCM 110 is conductive (almost metallic). It is notable however that each of the grains is randomly oriented with respect to the other grains resulting in an overall poly-crystalline material. In the amorphous state, there is no order in the material and PCM 110 is highly resistive. These two states make phase-change materials particularly well-suited for storing data.

As shown in FIG. 1, to change PCM 110 from the amorphous to the poly-crystalline state a programming pulse 132 is applied to heater 108 in order to heat PCM 110 above its crystallization temperature for a sufficiently long time. See RESET pulse 134/SET pulse 136. The PCM 110 will arrange itself into a poly-crystalline state during that heating time. To change the material from the poly-crystalline state to the amorphous state PCM 110 will be heated above its melting temperature and then quenched (quickly cooled). See programming pulse. The PCM 110 will not have time to rearrange itself in an ordered state, and an amorphous state will result. Both the crystallization temperature and melting temperature vary depending on the particular phase change material being employed. For example, for $Ge_2Sb_2Te_5$ the crystallization temperature is approximately 160° C. while the melting temperature is above 600° C.

As provided above, insulator 112 is formed from a material that is an electrical insulator while at the same time a good thermal conductor. Thus, insulator 112 electrically isolates the heater 108 from PCM 110, thereby permitting readout of PCM RPU 100 via first electrode 104 and second electrode 106. However, insulator 112 thermally couples heater 108 to the PCM 110 thereby permitting heat generated by heater 108 to pass to the PCM 110 in order to program the PCM. Suitable materials for insulator 112 include, but are not limited to, metal nitrides (such as aluminum nitride (AlN) and/or boron nitride (BN)), ceramic and/or glass. For example, AlN, BN (in particular hexagonal BN), and diamond have excellent thermal conductivity and can be used as electrical insulators.

Figure 2:
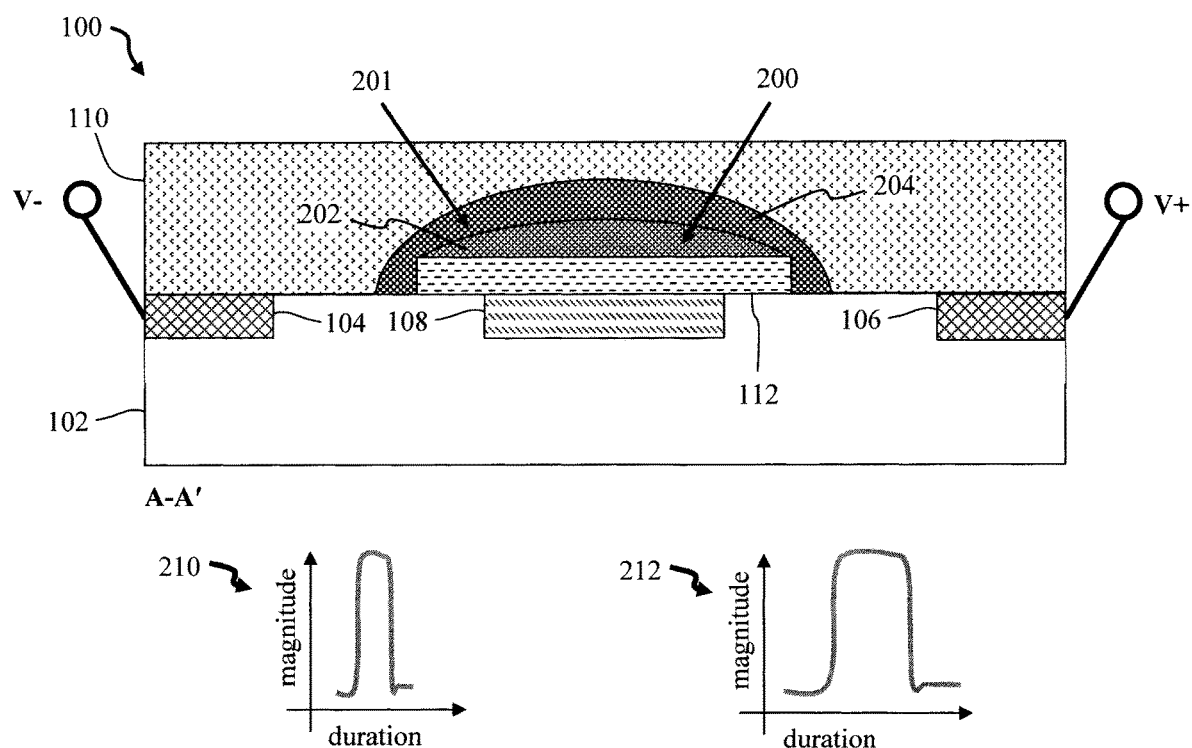
FIG. 2 is a cross-sectional diagram illustrating a view (i.e., through line A-A') of the PCM RPU device according to an embodiment of the present invention.

A cross-sectional view of PCM RPU 100 (i.e., through line A-A'—see FIG. 1) is provided in FIG. 2. As shown in FIG. 2, the first electrode 104, second electrode 106 and heater 108 are each at least partially embedded in the substrate 102. See, for example, the description of the present trench depth patterning approach provided below.

PCM 110 is present over the first electrode 104, the second electrode 106 and the heater 108. As shown in FIG. 2, the first electrode 104 and the second electrode 106 are in direct physical (and electrical) contact with PCM 110. Insulator 112 physically separates and electrically isolates the heater 108 from PCM 110. However, insulator 112 thermally couples the heater 108 to PCM 110. Namely, as highlighted above, insulator 112 is an electrical insulator while at the same time a good thermal conductor.

Figure 3:
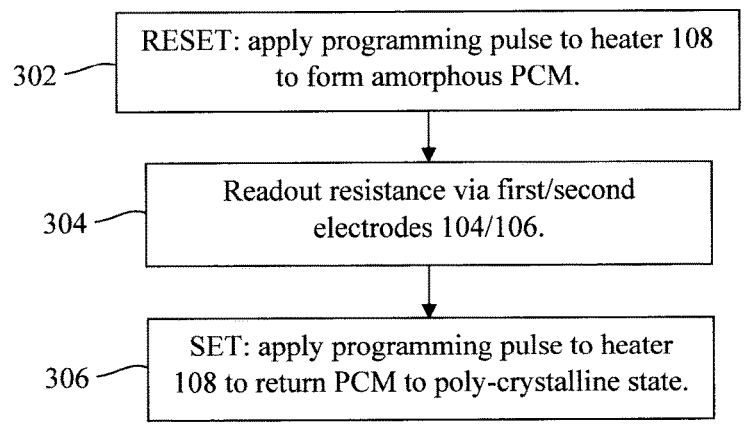
FIG. 3 is a diagram illustrating an exemplary methodology for operating the PCM RPU device according to an embodiment of the present invention.

Operation of PCM RPU 100 is now described by way of reference to methodology 300 of FIG. 3 in conjunction with FIG. 2. In this example the PCM 110 is in a poly-crystalline/electrically-conductive state, and a programming pulse is used to heat the PCM 110 in order to form the amorphous material which increases the resistance of the PCM 110 between the first electrode 104 and the second electrode 106.

Thus, in step 302 of methodology 300, during a RESET process a programming pulse is applied to heater 108. As provided above, heater 108 is a resistive heating element, meaning that when a programming pulse (i.e., a voltage pulse) is applied to heater 108 this will cause heater 108 to heat up by an amount and for a length of time commensurate with the magnitude and duration of the programming pulse. The heat generated by heater 108 will heat at least a portion of the PCM 110 adjacent to the heater 108, causing the heated portion of the PCM 110 to change from the poly-crystalline/electrically-conductive state to the amorphous/resistive state.

As shown in FIG. 2, the size of the programming pulse can impact the size of the amorphous material created in PCM 110. For instance, application of a programming pulse 200 to heater 108 results in the formation of amorphous material 202 in PCM 110 proximate to heater 108. On the other hand, if a programming pulse 201 (which is of a greater duration than programming pulse 200, e.g., see plot 210 of the magnitude and duration of programming pulse 200 and plot 212 of the magnitude and duration of programming pulse 201) is instead applied to heater 108, then the size of the amorphous material 204 formed in PCM 110 proximate to heater 108 is greater, i.e., amorphous material 204 is larger in size than amorphous material 202. This is a notable design feature that enables PCM RPU 100 function as a variable resistor.

Namely, the resistance in PCM 110 between first electrode 104 (V−) and second electrode 106 (V+) is less with amorphous material 202 than it is with amorphous material 204. For example, with programming pulse 1 PCM RPU 100 has a resistance R1 and with programming pulse 2 PCM RPU 100 has a resistance R2, wherein R1<R2. In fact, one could even envision a scenario where an even larger programming pulse is applied that forms an amorphous material (not shown) that extends all the way to the top of PCM 110, effectively blocking current from V− to V+. Thus, by varying the size of the programming pulse, the resistance of the PCM 110 can be easily and effectively tuned.

In step 304 of methodology 300, a readout of PCM RPU 100 is performed by measuring the resistance between the first electrode 104 (V−) and the second electrode 106 (V+). As provided above, based on the present four-terminal design, readout of PCM RPU 100 is performed via these separate terminals which are distinct from the heater 108 terminals. By way of example only, one notable advantage of the present four-terminal design is that heater 108 can be used to program the resistance of PCM RPU 100 while readout is performed at the same time via first electrode and second electrode 106. To look at it another way, steps 302 and steps 304 of methodology 300 can be performed concurrently, if so desired.

In step 306 of methodology 300, during a SET process the PCM 110 is returned to its poly-crystalline/conductive state. As provided above, this involves heating the PCM 110 above its crystallization temperature for a sufficiently long time. Namely, a SET pulse (i.e., a voltage pulse) is applied to heater 108 which will cause heater 108 to heat up by an amount and for a length of time commensurate with the magnitude and duration of the SET pulse. Heat generated by heater 108 will heat the PCM 110, causing the PCM 110 to change from the amorphous/resistive state back to the poly-crystalline/electrically-conductive state. The SET pulse is usually lower in magnitude than the RESET pulse since the crystallization temperature is typically lower than the melting temperature needed for amorphization. For example, as provided above, in GeSbTe 2:2:5 the crystallization temperature is about 160° C. while the melting temperature is above 600° C. It is also possible to crystallize the PCM from melt if the cooling is gradual. This can be achieved by modifying a RESET pulse (a RESET pulse causes the PCM to melt) such that the pulse shape will have a gradual (tapered) trailing edge. This allows for a slow cooling that leads to crystallization. If the trailing edge of the RESET pulse is abrupt, the molten PCM will solidify in the amorphous phase (this is also known as melt-quench).

Figure 4:
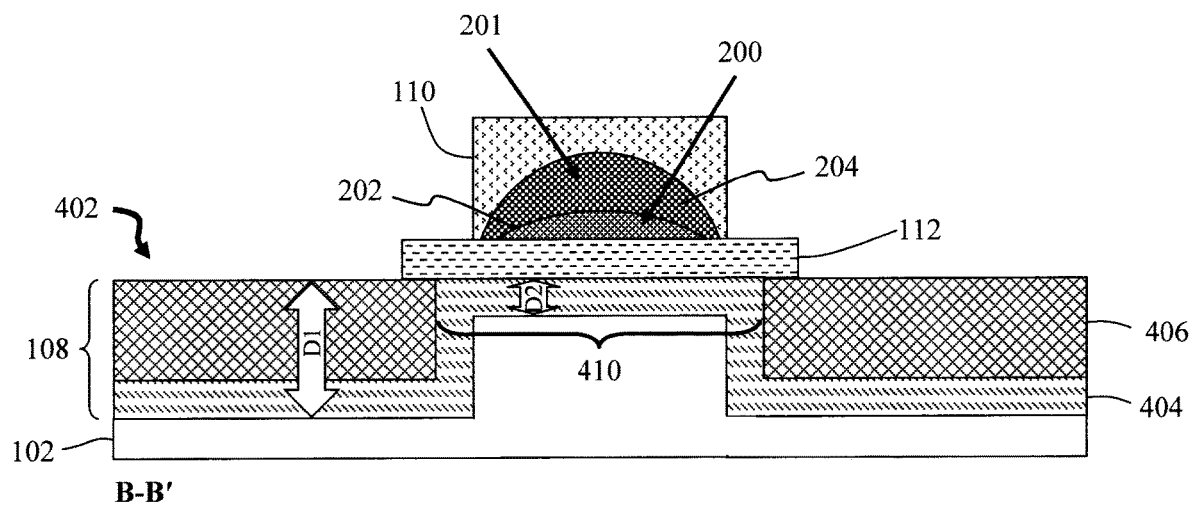
FIG. 4 is a cross-sectional diagram illustrating a view (i.e., through line B-B') of the PCM RPU device according to an embodiment of the present invention.

As highlighted above, a unique process using trench depth patterning can be employed for forming the heater 108. See, for example, FIG. 4 which provides a cross-sectional view of PCM RPU 100 (i.e., through line B-B'—see FIG. 1). As shown in FIG. 4, heater 108 is formed from a combination of materials, such as a first material 404 and a second material 406. First material 404 has a higher resistivity than second material 406. For instance, first material 404 has a resistivity r1 and second material 406 has a resistivity r2, wherein r1>r2. According to an exemplary embodiment, the first material 404 is TaN and/or carbon doped with hydrogen, and the second material 406 is TiN and/or tungsten (W).

First material 404 and second material 406 are deposited into a trench 402 in substrate 102 that has a first depth D1 to either side of the PCM 110, and a second depth D2 in a region of the trench 402 directly below the PCM 110 wherein D1>D2. See FIG. 4. Thus, when the first material 404 is deposited enough to fill the depth D2 of trench 402, a portion of the depth D1 of trench 402 remains unfilled. The remainder of the trench is then filled with the second material 406 over the first material 404 (followed by planarization using a process such as chemical-mechanical polishing). The result is that only the first material 404 is present in the depth D2 of trench 402, while a combination of the first material 404 and the second material 406 are present in the depth D1 of trench 402.

To use an illustrative, non-limiting example to illustrate this concept, say for example that the depth D1 is about 50 nm, and the depth D2 is about 10 nm, and the as-deposited material 404 is about 20 nm thick and the as-deposited material 406 is about 200 nm thick. After polishing by chemical mechanical polishing (CMP), the first planarized material 404 has a thickness of about 10 nm, and the second material 406 has a thickness of about 30 nm. It is important that the deposited material 404 will be thicker than depth D2, or otherwise material 406 will also cap the material 404 in the region with a depth D2.

As such, by this trench depth patterning approach, a thin layer (i.e., from about 5 nm to about 20 nm and ranges therebetween) of the relatively higher resistivity first material 404 forms a resistive heating element 410 below the PCM 110. A combination of the first material 404 and a thicker layer (i.e., from about 30 nm to about 45 nm and ranges therebetween) of the relatively lower resistivity second material 406 is connected to both sides of the resistive heating element. During operation, the programming pulse will cause the resistive heating element to heat up via resistive heating. Advantageously, the resistive heating element is localized to the region of heater 108 below PCM 110, thus making programming of the PCM RPU 100 more efficient. To look at it another way, much more energy would be needed to heat the entire line that makes up heater 108, as opposed to the small (resistive heating element) portion beneath PCM 110.

As highlighted above, this process requires the patterning of a trench 402 in substrate 102 that has a first depth D1 to either side of the PCM 110, and a second depth D2 (directly below the PCM 110), wherein D1>D2. According to an exemplary embodiment, this variable depth trench is created by first patterning trench 402 in substrate 102 to the first depth D1. Oxide is then added locally to the bottom of a portion of the trench 402 below where the PCM 110 will be deposited. Adding the oxide makes that portion of the trench shallower (i.e., to the depth D2).

Figure 5:
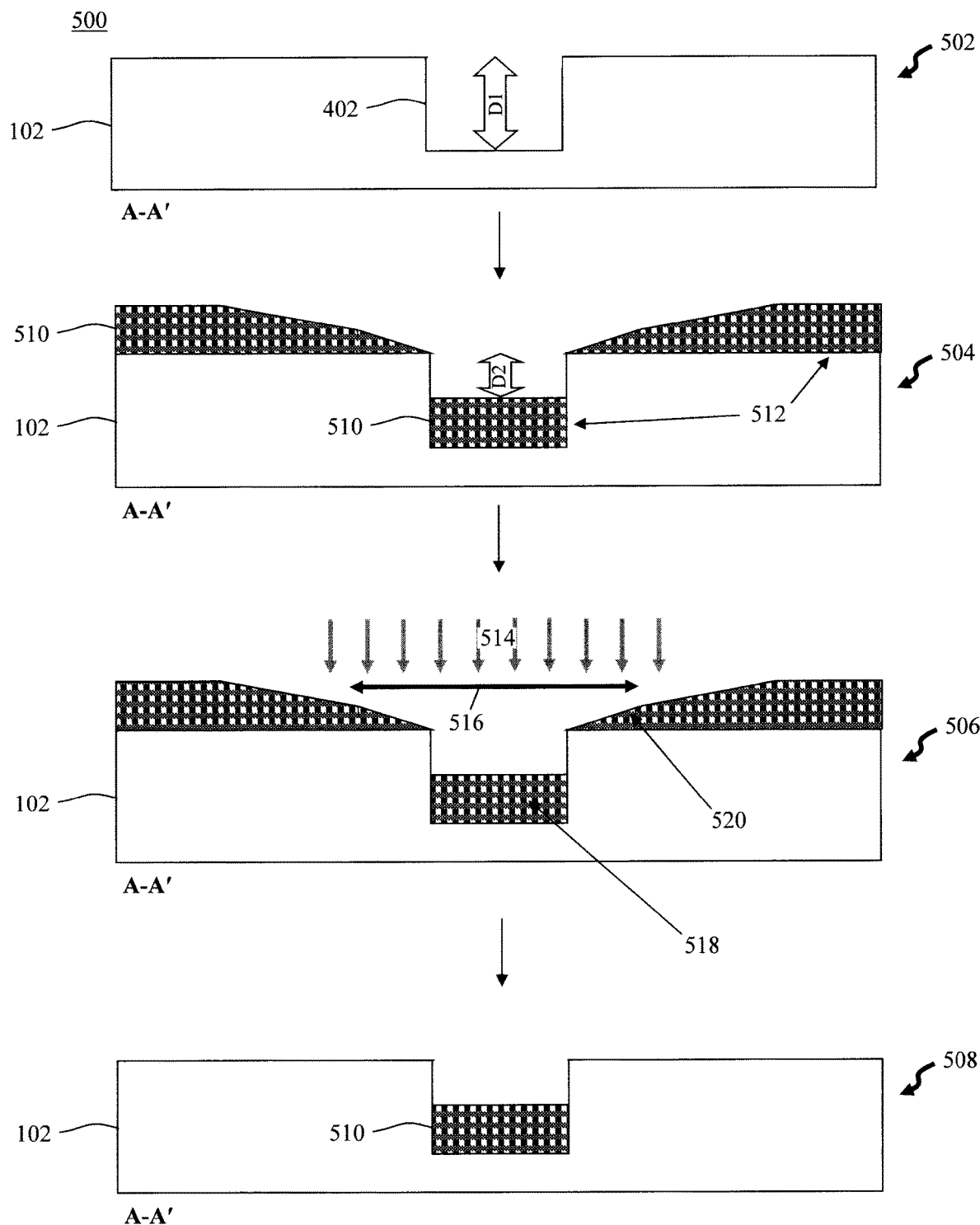
FIG. 5 is a diagram illustrating an exemplary methodology for trench depth patterning according to an embodiment of the present invention.

This concept is further illustrated by way of reference to exemplary methodology 500 of FIG. 5. FIG. 5 depicts cross-sectional views of a section 114 of PCM RPU 100 (i.e., through line A-A'—see FIG. 1). As shown in step 502, trench 402 is patterned in substrate 102 to the first depth D1. Standard lithography and etching techniques can be employed for patterning trench 402 in substrate 102.

In step 504, hydrogen silsesquioxane (HSQ) 510 is then deposited onto substrate 102 including into the trench 402, reducing a depth of the trench to depth D2, wherein D1>D2. A casting process such as spin-coating can be employed to deposit HSQ 510 onto substrate 102. According to an exemplary embodiment, the HSQ 510 has a thickness in trench 402 from about 20 nm to about 45 nm and ranges therebetween (see above). As shown in step 504, the HSQ 510 has a constant thickness 512 within trench 402. However, outside of the trench 402 this is not the case. Namely, the HSQ 510 is thinner on the surface of substrate 102 near the edge of trench 402. Moving away from trench 402 the thickness of HSQ 510 increases along the surface of substrate 102 until it reaches the constant thickness 512.

This configuration of HSQ 510 both in the trench 402 and along the surface of substrate 102 is important. Namely, the goal is to remove all but the HSQ in a portion of trench 402. The HSQ 510 that remains in trench 402 is the oxide (see above) that is added to locally make the trench shallower. As will be described in detail below, an electron-beam (e-beam) exposure will be used to cross-link the HSQ 510. A developer will then be used to remove any non-cross-linked HSQ 510. The only cross-linked HSQ 510 should be in trench 402, and the non-cross-linked HSQ 510 should include all of the HSQ 510 outside of the trench 402.

To do so, the present techniques leverage the fact that the thinner the layer of HSQ, the higher the e-beam dose that is needed to cross-link the HSQ. Thus, as in the present example, if there are varying thicknesses of HSQ, then the e-beam dose needed to cross-link the thicker portions (such as in trench 402) will leave the thinner portions (such as on the surface of substrate 102 at the edge of trench 402) non-cross-linked. To look at it another way, the e-beam dose needed to cross-link the thicker portions of HSQ 510 in trench 402 is less than the dose needed to cross-link the thinner portions HSQ 510 on the surface of substrate 102 at the edge of trench 402. See, for example, Sidorkin et al., "Resist thickness effects on ultra thin HSQ patterning capabilities," Microelectronic Engineering 86, pp. 749-751 (January 2009), the contents of which are incorporated by reference as if fully set forth herein.

Namely, as shown in step 506 e-beam exposure 514 is used to cross-link the HSQ 510. Even though the exposure area 516 extends slightly beyond the trench 402, the HSQ 510 on the surface of substrate 102 at the edge of the trench 402 is thinner. Thus, with the e-beam dose needed to cross-link the (thicker) HSQ 510 in trench 402, the HSQ 510 on the surface of substrate 102 at the edge of the trench 402 will remain non-cross-linked. Namely, the dose is high enough to cross-link the portion 518 of HSQ 510 in trench 402 since portion 518 of HSQ 510 is thick. However, the dose is not high enough to cross-link portions 520 of the HSQ 510 on the surface of substrate 102 at the edge of the trench 402 since those portions 520 of the HSQ 510 are thin, and thus will dissolve in developer. By way of this process, a portion of the HSQ 510 is selectively cross-linked within the trench 402. It is notable that the e-beam exposure area in the B-B' direction (i.e., the direction into and out of the page in FIG. 5) will limit cross-linking to the portion of the HSQ 510 within trench 402 below where the PCM 112 will be.

Thus, when exposed to a developer which removes non-cross-linked HSQ 510, all that will remain is cross-linked HSQ 510 within a portion trench 402. See step 508. Any suitable commercially-available developer can be employed. As provided above, the (cross-linked) HSQ 510 that remains in trench 402 is the oxide (see above) that is added to locally make a portion of the trench 402 shallower at the depth D2. Notably, within the trench 402, in the B-B' direction, the cross-linked HSQ 510 will be local to the area of trench 402 below where the PCM 110 will be. Following the exposure to the developer, the cross-linked HSQ that remains can be annealed to densify the HSQ and turn it into a high-quality oxide ($SiO_2$). An anneal temperature of greater than or equal to about 750° C. is often needed to fully convert the HSQ into $SiO_2$. However, a lower annealing temperature (of less than about 400° C.) can be used if the annealing is combined with $O_2$ plasma and/or ultraviolet (UV) radiation.

Figure 6:
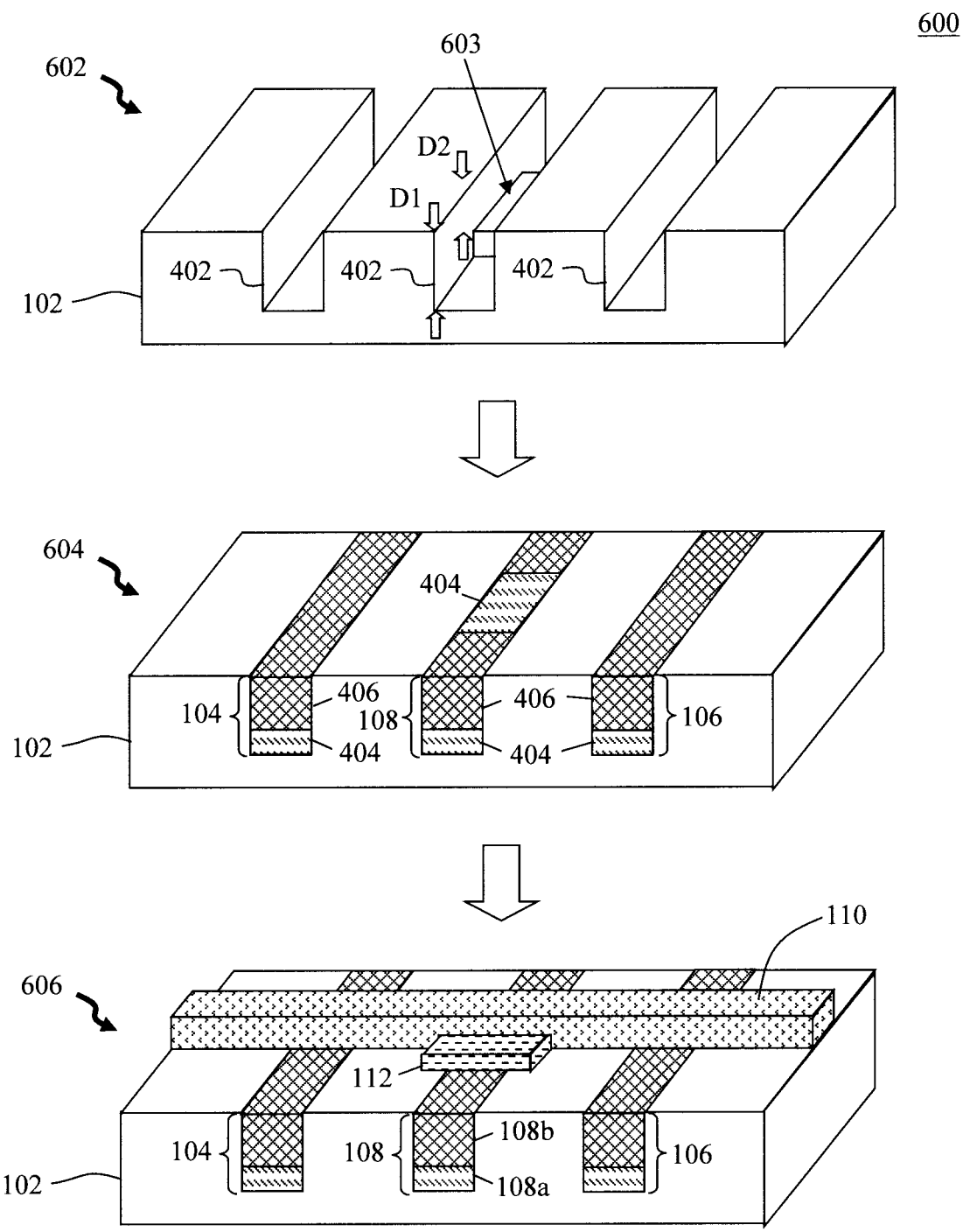
FIG. 6 is a diagram illustrating an exemplary methodology for forming the PCM RPU device according to an embodiment of the present invention.

An exemplary methodology 600 for forming PCM RPU 100 is now described by way of reference to FIG. 6. As shown in step 602, multiple trenches 402 are patterned in substrate 102. Namely, in this example, the first electrode 104, the second electrode 106, and the heater 108 are formed concurrently, each corresponding to one of the trenches 402. Standard lithography and etching techniques can be employed to pattern the trenches 402 in substrate 102.

According to an exemplary embodiment, the trenches 402 are patterned to depth D1 (e.g., depth D1 is from about 50 nm to about 60 nm and ranges therebetween), and the steps of methodology 500 of FIG. 5 (described above) are then performed to form the oxide 603 (e.g., cross-linked HSQ) locally on the bottom of the center trench to make the center trench shallower (e.g., a depth D2 of from about 15 nm to about 20 nm and ranges therebetween) beneath the location of the PCM. During this process, HSQ is deposited over the entire wafer and then patterned using, e.g., e-beam lithography. With e-beam lithography, the pattern stored in the tool's memory controls the e-beam exposure. Regions that are exposed to the electron beam are cross-linked (assuming the exposure dose is sufficient as described above). Namely, as provided above, any HSQ that happens to deposit on the surface of substrate 102 at the edge of the trench will be thin and thus will not become cross-linked during the e-beam exposure.

As shown in step 604, in this example the first electrode 104, the second electrode 106, and the heater 108 are formed from a combination of first material 404 and second material 406. As described above, first material 404 has a higher resistivity (r1) than second material 406 (r2), i.e., r1>r2. According to an exemplary embodiment, the first material 404 is TaN and/or carbon doped with hydrogen, and the second material 406 is TiN and/or W.

First material 404 is then deposited into the trenches 402. The first material 404 is deposited over the cross-linked HSQ that makes a portion of the center trench 402 shallower. A second material 406 is then deposited over the first material 404. A process such as evaporation, sputtering (physical vapor deposition, PVD), chemical vapor deposition (CVD), atomic layer deposition (ALD) or electrochemical plating can be employed to deposit the first/second materials 404/406. Following deposition, the first/second materials 404/406 are planarized using a process such as CMP. As shown in step 604, based on the shallower depth (D2) in the center trench 402, only a thinner (e.g., from about 10 nm to about 20 nm and ranges therebetween) layer of the first material 404 is present in the portion of the center trench 402 over which the PCM 110 will be formed (see below). As described above, this segment of the first material 404 under the PCM 110 forms a resistive element for localized heating of the PCM 110. Everywhere else, the trenches 402 are filled with a combination of the first material 404 and second material 406. As provided above, the second material 406 can have a thickness of from about 30 nm to about 40 nm and ranges therebetween.

In step 606, insulator 112 is deposited onto the heater 108 over the resistive heating element, and PCM 110 is formed (orthogonally) over the first electrode 104, the second electrode 106 and the heater 108/insulator 112. As provided above, suitable materials for insulator 112 that are electrical insulators while at the same time good thermal conductors include, but are not limited to, aluminum nitride (AlN), boron nitride (BN) (in particular hexagonal BN) and/or diamond. For instance, by way of example only, boron nitride (BN) is deposited as a blanket film and then patterned by lithography and RIE to cover the heater 108 over the resistive heating element.

To form the PCM 110 over the first electrode 104, the second electrode 106 and the heater 108/insulator 112, a blanket PCM film is first deposited and then patterned into the bar-shaped PCM 110 structure shown in step 606. Lithography and etching processes using a directional (anisotropic) etch such as reactive ion etching (RIE) can be employed to pattern the PCM 110. According to an exemplary embodiment, the PCM 110 is deposited using a process such as PVD or CVD. The specific targets (PVD) or precursors (CVD) for the deposition process depend of course on the particular phase change material being formed. For example, when physical vapor deposition (PVD) is used to deposit $Ge_2Sb_2Te_5$ the most common source is a $Ge_2Sb_2Te_5$ target. Separate elemental Ge, Sb and Te targets can also be used by adjusting the flux from each target to obtain the desired composition. In another example, molecular beam epitaxy (MBE) can also be used to deposit $Ge_2Sb_2Te_5$. When MBE is used the sources are usually individual Knudsen effusion cells. Each cell contains one of the alloy elements (Ge, Sb or Te), and the flux of each element is controlled by the effusion cell temperature. According to an exemplary embodiment, the deposition of PCM 110 is performed at a high substrate temperature, for example, at a substrate temperature of from about 150 degrees Celsius (° C.) to about 300° C. For example, for $Ge_2Sb_2Te_5$ the preferred temperature range is from about 175° C. to about 200° C. The result is formation of crystalline PCM 110. A room temperature deposition would typically yield amorphous material when $Ge_2Sb_2Te_5$ is deposited. However, some phase change materials such as $Sb_2Te_3$ would be crystalline even at deposition temperatures below 100° C.

Another notable feature of the present PCM RPU 100 design is that the variable PCM 110 can be used to change the phase of light reflected off the surface of PCM RPU 100, creating a tunable metasurface. See FIG. 7. Metasurfaces typically use an array of similar elements to manipulate the phase of light reflected off of the surface. However, these elements are primarily constant elements that are not tunable in any way. Tunability of the elements, for example allowing each element to change its refractive index in response to an electrical input, can allow one to change the functionality of the metasurface when interacting with light.

Figure 7:
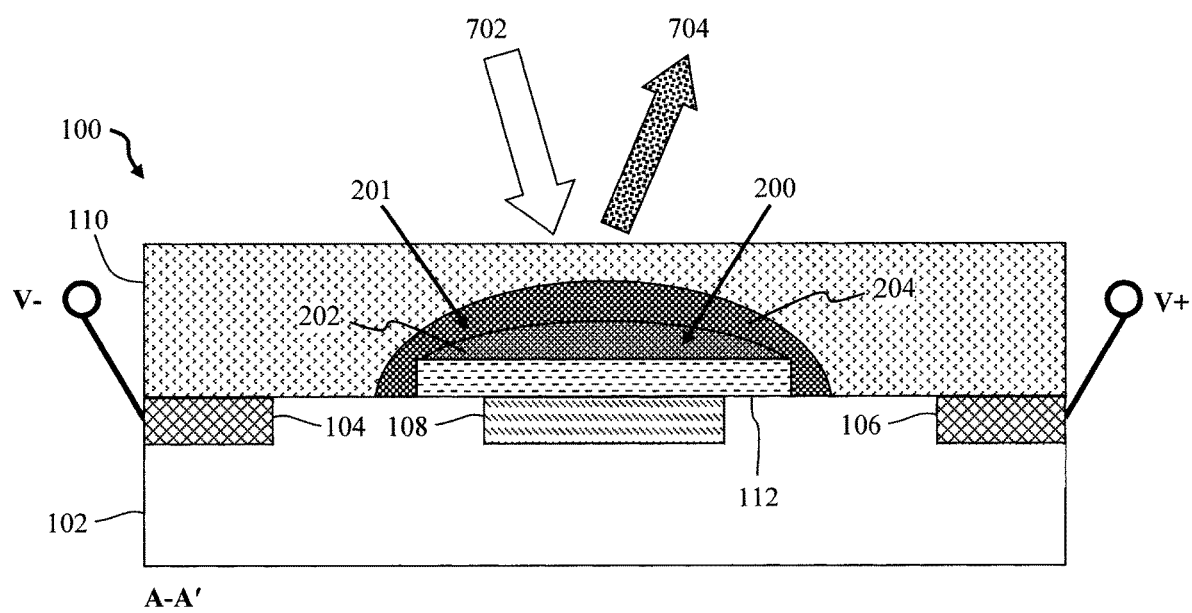
FIG. 7 is a cross-sectional diagram illustrating a view (i.e., through line A-A') of the PCM RPU device as a tunable metasurface according to an embodiment of the present invention.

Advantageously, light reflects differently when it is incident on an amorphous versus poly-crystalline PCM material due to the large difference in their optical properties. As such, since the amount of amorphous versus poly-crystalline PCM 110 of the present PCM RPU 100 is variable and can be tuned, the present PCM RPU designs can be used to create a tunable metasurface with variable degrees of light manipulation. Namely, as shown in FIG. 7 (and as described in detail above), the size of the programming pulse can impact the size of the amorphous material created in PCM 110, and thus the amount of amorphous versus poly-crystalline PCM 110. Thus, when light 702 is incident on PCM 110, the reflected light 704 will reflect differently depending on the configuration of the programmed PCM 110. FIG. 7 is showing just a single element in an array of PCM 110 elements which forms the metasurface. Each PCM 110 element in the array can be addressed separately (like pixels on a computer screen) and can be programed to have a different amount of amorphous PCM (from none to fully amorphous). The speed of programing PCM 110 elements depends on the PCM material and is typically from about 100 nanoseconds (ns) to about 1000 ns for GST 225. This fast configurability allows the programmable metasurface to be used for beam stirring or fast lensing in applications such as automobile LIDAR (light detection and ranging).

Although illustrative embodiments of the present invention have been described herein, it is to be understood that the invention is not limited to those precise embodiments, and that various other changes and modifications may be made by one skilled in the art without departing from the scope of the invention.

What is claimed is:
1. A resistive processing unit (RPU) device, comprising:
a first electrode;
a second electrode;
a heater; and
a phase change material (PCM) disposed over the first electrode, the second electrode and the heater, wherein the heater comprises a combination of a first material having a resistivity r1 and a second material having a resistivity r2, wherein r1>r2, and wherein only the first material is present beneath the PCM and comprises a resistive heating element.

2. The RPU device of claim 1, wherein the first electrode is oriented parallel to the second electrode, and wherein the heater is present in between the first electrode and the second electrode.

3. The RPU device of claim 2, wherein the PCM is oriented orthogonal to the first electrode, the second electrode and the heater.

4. The RPU device of claim 1, wherein the PCM is in direct contact with the first electrode, the second electrode.

5. The RPU device of claim 1, further comprising:
an insulator separating the PCM from the heater.

6. The RPU device of claim 5, wherein the insulator comprises an electrical insulator that is a thermal conductor.

7. The RPU device of claim 6, wherein the insulator comprises a material selected from the group consisting of: aluminum nitride (AlN), boron nitride (BN), hexagonal BN, diamond, and combinations thereof.

8. The RPU device of claim 1, wherein the first material is selected from the group consisting of: tantalum nitride (TaN), carbon doped with hydrogen, and combinations thereof, and wherein the second material is selected from the group consisting of: titanium nitride (TiN), tungsten (W), and combinations thereof.

9. The RPU device of claim 1, wherein the first material comprises TaN, and wherein the second material comprises TiN.

10. The RPU device of claim 1, further comprising:
a substrate on which the first electrode, the second electrode and the heater are disposed, wherein the substrate comprises a trench in which the heater is present, and wherein the trench has a first depth D1 to either side of the PCM, and a second depth D2 directly below the PCM, wherein D1>D2.

11. A method of forming an RPU device, the method comprising the steps of:
forming a first electrode and a second electrode on a substrate, wherein the first electrode is oriented parallel to the second electrode;
forming a heater on the substrate in between the first electrode and the second electrode; and
depositing a PCM onto the first electrode, the second electrode and the heater.

12. The method of claim 11, wherein the step of forming the heater further comprises the steps of:
patterning a trench in the substrate to a depth D1;
depositing hydrogen silsesquioxane (HSQ) onto the substrate and into the trench to reduce the trench to a depth D2, wherein D1>D2;
cross-linking the HSQ within the trench to form cross-linked HSQ in a select portion of the trench;
removing non-cross-linked HSQ;
depositing a first material having a resistivity r1 into the trench over the cross-linked HSQ;
depositing a second material having a resistivity r2 over the first material, wherein r1>r2; and
planarizing the first material and the second material such that, following the planarization, only the first material is present in the select portion of the trench and comprises a resistive heating element.

13. The method of claim 12, wherein the cross-linking is performed using electron-beam (e-beam) exposure.

14. The method of claim 12, wherein the HSQ deposited into the trench is thicker than the HSQ deposited on a surface of the substrate near an edge of the trench.

15. The method of claim 12, wherein the first material is selected from the group consisting of: TaN, carbon doped with hydrogen, and combinations thereof, and wherein the second material is selected from the group consisting of: TiN, W, and combinations thereof.

16. The method of claim 11, further comprising the step of:
depositing an insulator onto the heater such that the PCM is deposited on the heater over the insulator, wherein the insulator comprises an electrical insulator that is a thermal conductor.

17. The method of claim 11, wherein the PCM is oriented orthogonal to the first electrode, the second electrode and the heater.

18. A method of operating an RPU device, the method comprising the steps of:
providing the RPU device comprising: a first electrode, a second electrode, a heater, and a PCM disposed over the first electrode, the second electrode and the heater; and
applying a programming pulse to the heater to convert at least a portion of the PCM from a poly-crystalline state to an amorphous state.

19. The method of claim 18, further comprising the step of:
applying a SET pulse to the heater to convert the PCM from the amorphous state back to the poly-crystalline state.

* * * * *